United States Patent
Heimlicher

Patent Number: 6,133,654
Date of Patent: Oct. 17, 2000

[54] INDUCTIVE PROXIMITY SWITCH WITH A ONE-PIECE HOUSING

[75] Inventor: Peter Heimlicher, Freiburg, Switzerland

[73] Assignee: Optosys SA, Givisiez, Switzerland

[21] Appl. No.: 09/243,782

[22] Filed: Feb. 3, 1999

[30] Foreign Application Priority Data

Feb. 13, 1998 [EP] European Pat. Off. .............. 98810116

[51] Int. Cl.$^7$ ...................................................... H02B 1/24
[52] U.S. Cl. ...................................... 307/128; 324/207.16
[58] Field of Search .................................. 307/116, 128; 324/207.12, 207.16, 207.22, 207.26, 225, 253; 335/205, 296, 301, 302, 304; 336/110

[56] References Cited

U.S. PATENT DOCUMENTS

| | | | |
|---|---|---|---|
| 5,285,154 | 2/1994 | Burreson | 324/207.16 |
| 5,498,958 | 3/1996 | Tu et al. | 324/207.16 |

FOREIGN PATENT DOCUMENTS

| | | |
|---|---|---|
| 0 492 029 | 7/1992 | European Pat. Off. . |
| 39 34 593 | 4/1991 | Germany . |
| 195 16 934 | 8/1996 | Germany . |

OTHER PUBLICATIONS

An English language abstract of German Patent No. DE 195 16 934 C1, (Aug. 1996).
An English language abstract of German Patent No. DE 39 34 593 A1, (Apr. 1991).

*Primary Examiner*—Stephen W. Jackson
*Assistant Examiner*—Andre A. Henry
*Attorney, Agent, or Firm*—Foley & Lardner

[57] ABSTRACT

An inductive proximity switch is provided which comprises a coil, means for supplying the coil with periodic transmitting current pulses, and means for processing signals which correspond to voltages induced in said coil after the end of a transmitting current pulse by the decaying current which previously flows in the detected body due to the voltage induced therein by the transmitting current pulse. In order to improve the robustness of the proximity switch so that it is suitable for durable use in an aggressive environment, the coil, the means for supplying the coil with a periodical transmitting current, and the signal processing means are arranged in a cylindrical housing which is closed on the side of the active surface of the proximity switch and consists of a metal which is not ferromagnetic and whose specific electric resistance is relatively high.

15 Claims, 1 Drawing Sheet

INDUCTIVE PROXIMITY SWITCH WITH A ONE-PIECE HOUSING

FIELD OF THE INVENTION

The present invention generally relates to an inductive proximity switch and more specifically relates to an inductive proximity switch comprising:

a coil;

means for supplying the coil with periodic transmitting current pulses; and means for processing signals which correspond to voltages induced in said coil after the end of a transmitting current pulse by the decaying current which previously flows in the detected body due to the voltage induced therein by the transmitting current pulse.

BACKGROUND OF THE INVENTION

One inductive proximity switch is known from European patent specification EP-A-0492029 B1. In this proximity switch, coil 12 is supplied with periodical transmitting current pulses. The effective signal is obtained by a suitable electronic circuit which responds to the received voltage induced in coil 12 by the decaying of the current which previously flows in the detected body due to the voltage induced therein by the transmitting current pulse.

In a development of the proximity switch known from EP-A0492029 B1, the just mentioned voltage induced in the coil is integrated over a relatively short time window in order to obtain a smoothened useful signal after suitable processing. This signal is compared to a reference voltage in order to generate an output signal which signals the presence of a detected body in the vicinity of the proximity switch if such a body is present. Such a proximity switch allows an outstanding switching distance in the detection of metallic bodies, e.g. of aluminum or steel.

The components of known proximity switches operating according to the principle described in EP-A-0492029 B1 are usually contained in a housing which consists of two or more parts. The housing generally composed at least of an elongate metallic cylinder and of a cap of a synthetic material which seals active surface 24, i.e. the exit surface of the magnetic field generated by the coil. Such a housing is inappropriate for applications where the proximity switch is exposed to shocks on the synthetic cap, to particularly aggressive environments, or to an increased ambient pressure. Such ambient conditions require a very rugged housing. In particular, it is very difficult to achieve a liquid- and gas-tight seal of the cap of the proximity switch. If a conventional proximity switch is used in the cited environments, the components of the proximity switch will be damaged quickly and a short lifetime of the latter is likely.

SUMMARY OF THE INVENTION

An aim of the invention is therefore to provide an inductive proximity switch of the kind described in European patent specification EP-A-0492029 B1 which is suitable for use under conditions of mechanical stresses exerted on the active surface of the proximity switch, in aggressive environments, and under high ambient pressure, and which still allows an outstanding switching distance in the detection of metallic bodies, e.g. of aluminum or steel.

According to the invention, this aim is attained by an inductive proximity switch of the kind described in European patent specification EP-A-0492029 B1 wherein said coil, said, means for supplying the coil with a periodical transmitting current, and said means for processing said signals are arranged in a cylindrical housing which is closed on the side of the active surface of the proximity switch and which consists of a metal which is not ferromagnetic and whose specific electric resistance is relatively high.

The robustness of a proximity switch according to the invention is such that it can even be used for very demanding applications in extremely difficult environments while the positive properties of the proximity switch, especially the outstanding switching distance it allows in the detection of metallic bodies, e.g. of aluminum or steel, are conserved.

BRIEF DESCRIPTION OF THE DRAWINGS

An exemplary embodiment of the invention is described hereinafter with reference to the accompanying FIGS. 1 and 2.

DETAILED DESCRIPTION OF THE PREFERRED EMBODIMENT

Figure 1:
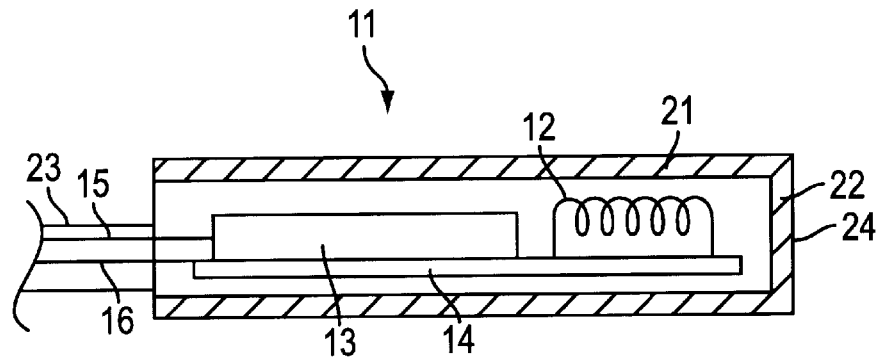
FIG. 1 shows a schematic cross-section of a proximity switch according to the invention.

As shown in a schematic manner in FIG. 1, a proximity switch 11 according to the invention contains a coil 12 and an electronic circuit 13. Circuit 13 comprises means for supplying coil 12 with periodic transmitting current pulses having a period T which is typically comprised between 50 and 500 microseconds, and means for the processing of signals which correspond to induced voltages generated in coil 12 when a detected body is situated within the range of the variable magnetic field which is built up by coil 12 as it is supplied with the periodical transmitting current. The operation of circuit 13 is as described in European patent specification EP-A-0492029 B1.

Coil 12 and circuit 13 are e.g. mounted on a printed circuit board 14. Electronic circuit 13 is connected by conductors 15 and 16 of a cable 23 to the apparatus or system (not shown) where the signals obtained by proximity switch 11 are further processed.

Figure 2:
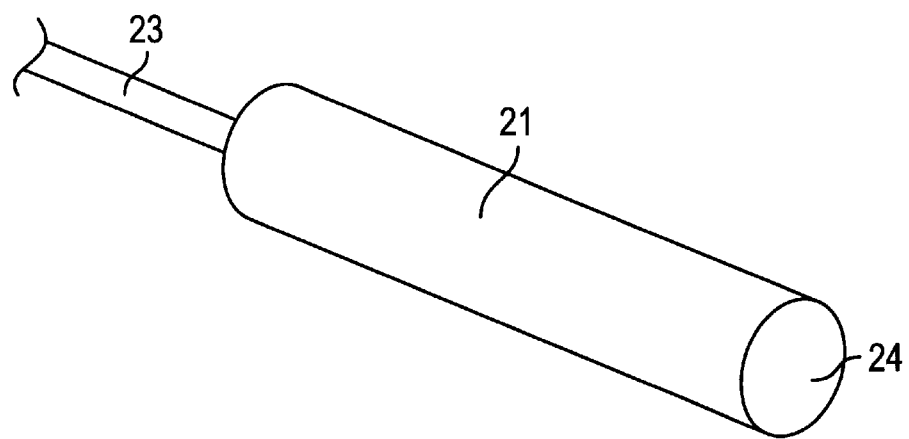
FIG. 2 shows a perspective view of the proximity switch according to FIG. 1.

As shown in FIG. 1, all components of a proximity switch 11 according to the invention are arranged in a housing 21 which consists of a single piece, that is of a housing which is a one-piece housing. As shown by FIG. 2, housing 21 has preferably a cylindrical shape. Housing 21 can however have any other suitable shape. It can for instance have the shape of an elongated quadrangular right prism. Housing 21 also includes a closure 22 of the cylinder or prism on the side of the active surface 24 of the proximity switch. Closure 22 replaces the cap used in embodiments of the prior art and has approximately the same wall-thickness as such a prior art cap. As can be appreciated from FIG. 1, closure 22 has a wall-thickness which is sufficient to provide a good mechanical protection of coil 12 which lies behind it. In the case of a cylindrical housing 21, the wall-thickness of closure 22 lies in a range of 3 to 10% of the outer diameter of housing 21. In the case of a non-cylindrical housing 21, the wall-thickness of closure 22 lies in a range of 3 to 10% of the diameter of a circle inscribed into the active surface of proximity switch 11.

Housing 21 consists of a metal which is not ferromagnetic and whose specific electric resistance is relatively high, preferably non-magnetic stainless steel. Due to these properties, only very small eddy currents are produced in active surface 24 during operation of the proximity switch, and the voltages which are thereby induced in coil 12 are negligible in the measuring window of the useful signal. In the detected metallic bodies e.g. of steel or aluminum, however, substantially stronger eddy currents are generated, and the voltages thereby induced in the coil are strong enough to allow the detection of such bodies at an exceptionally large switching distance.

Housing 21 is entirely made of metal and therefore offers a very good protection of the components of proximity switch 11 from aggressive environments.

What is claimed is:

1. An inductive proximity switch comprising:

a coil;

means for supplying the coil with periodic transmitting current pulses; and means for processing signals which correspond to voltages induced in said coil after the end of a transmitting current pulse by the decaying current which previously flows in the detected body due to the voltage induced therein by the transmitting current pulse;

wherein said coil, said means for supplying the coil with a periodical transmitting current, and said means for processing said signals are arranged in a cylindrical housing which is closed on the side of the active surface of the proximity switch, said housing being made of a metal which is not ferromagnetic and whose specific electric resistance is relatively high.

2. An inductive proximity switch according to claim 1, wherein said housing is made of one piece.

3. An inductive proximity switch according to claim 1, wherein said housing is made of non-magnetic stainless steel.

4. An inductive proximity switch according to claim 2, wherein said housing is made of non-magnetic stainless steel.

5. An inductive proximity switch comprising:

a coil;

means for supplying the coil with periodic transmitting current pulses; and means for processing signals which correspond to voltages induced in said coil after the end of a transmitting current pulse by the decaying current which previously flows in the detected body due to the voltage induced therein by the transmitting current pulse;

wherein said coil, said means for supplying the coil with a periodical transmitting current, and said means for processing said signals are arranged in a cylindrical housing which is closed on the side of the active surface of the proximity switch, said housing being made of a metal which is not ferromagnetic and whose specific electric resistance is relative high; and wherein the period of the transmitting current pulses lies between 50 and 500 microseconds.

6. An inductive proximity switch comprising:

a coil;

means for supplying the coil with periodic transmitting current pulses; and means for processing signals which correspond to voltages induced in said coil after the end of a transmitting current pulse by the decaying current which previously flows in the detected body due to the voltage induced therein by the transmitting current pulse;

wherein said coil, said means for supplying the coil with a periodical transmitting current, and said means for processing said signals are arranged in a cylindrical housing which has a closure on the side of the active surface of the proximity switch, said housing being made of a metal which is not ferromagnetic and whose specific electric resistance is relative high; and wherein the thickness of said closure is in a range from 3 to 10 percent of the outer diameter of said cylindrical housing.

7. An inductive proximity switch comprising:

a coil;

means for supplying the coil with periodic transmitting current pulses; and means for processing signals which correspond to voltages induced in said coil after the end of a transmitting current pulse by the decaying current which previously flows in the detected body due to the voltage induced therein by the transmitting current pulse;

wherein said coil, said means for supplying the coil with a periodical transmitting current, and said means for processing said signals are arranged in a housing which has a closure on the side of the active surface of the proximity switch, said housing being made of a metal which is not ferromagnetic and whose specific electric resistance is relative high; and wherein said housing is non-cylindrical and wherein the thickness of said closure is in a range from 3 to 10 per cent of the diameter of a circle inscribed into the active surface of the inductive proximity switch.

8. An inductive proximity switch according to claim 5, wherein said housing is made of one piece.

9. An inductive proximity switch according to claim 5, wherein said housing is made of non-magnetic stainless steel.

10. An inductive proximity switch according to claim 6, wherein said housing is made of one piece.

11. An inductive proximity switch according to claim 6, wherein said housing is made of non-magnetic stainless steel.

12. An inductive proximity switch according to claim 6, wherein the period of the transmitting current pulses is between 50 and 500 microseconds.

13. An inductive proximity switch according to claim 7, wherein said housing is made of one piece.

14. An inductive proximity switch according to claim 7, wherein said housing is made of non-magnetic stainless steel.

15. An inductive proximity switch according to claim 7, wherein the period of the transmitting current pulses is between 50 and 500 microseconds.

* * * * *